(12) United States Patent  (10) Patent No.: US 8,704,282 B2
Marty et al.  (45) Date of Patent: Apr. 22, 2014

(54) METHOD FOR FORMING A BACK-SIDE ILLUMINATED IMAGE SENSOR

(75) Inventors: Michel Marty, Saint Paul de Varces (FR); François Roy, Seyssins (FR); Jens Prima, Siegen (DE)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/445,013

(22) Filed: Apr. 12, 2012

(65) Prior Publication Data

US 2012/0261732 A1 Oct. 18, 2012

(30) Foreign Application Priority Data

Apr. 12, 2011 (FR) ...................................... 11 53179

(51) Int. Cl.
*H01L 31/113* (2006.01)
*H01L 31/18* (2006.01)

(52) U.S. Cl.
USPC ............ 257/292; 257/E31.001; 257/E31.083; 438/57

(58) Field of Classification Search
CPC ... H01L 21/56; H01L 23/481; H01L 29/7869; H01L 35/02; H01L 21/02381; H01L 21/0254; H01L 21/02565; H01L 21/22; H01L 21/304; H01L 21/30604; H01L 21/76802; H01L 21/7685; H01L 23/31; H01L 23/485
USPC ............... 438/57; 257/228, E31.097, E27.13, 257/E27.133, 292, E31.001, E31.083
See application file for complete search history.

(56) References Cited

U.S. PATENT DOCUMENTS

| | | | |
|---|---|---|---|
| 2,200,084 A | 5/1940 | Hibbard | |
| 7,375,378 B2 * | 5/2008 | Manivannan et al. | 257/79 |
| 7,875,918 B2 | 1/2011 | Venezia et al. | |
| 8,390,089 B2 * | 3/2013 | Chen et al. | 257/447 |
| 2007/0052056 A1 | 3/2007 | Doi et al. | |
| 2009/0315132 A1 | 12/2009 | Murakoshi | |
| 2010/0123069 A1 | 5/2010 | Mao et al. | |
| 2010/0148289 A1 | 6/2010 | McCarten et al. | |
| 2010/0193845 A1 | 8/2010 | Roy et al. | |
| 2010/0237451 A1 | 9/2010 | Murakoshi | |

FOREIGN PATENT DOCUMENTS

EP 1995783 A2 11/2008
WO WO 2009023603 A1 2/2009

OTHER PUBLICATIONS

French Search Report and Written Opinion dated Sep. 14, 2011 from corresponding French Application No. 11/53179.
French Search Report and Written Opinion dated Sep. 14, 2011 from related French Application No. 11/53183.
French Search Report and Written Opinion dated Sep. 15, 2011 from related French Application No. 11/53178.
French Search Report and Written Opinion dated Sep. 12, 2011 from related French Application No. 11/53177.

* cited by examiner

*Primary Examiner* — Matthew W. Such
*Assistant Examiner* — Monica D Harrison
(74) *Attorney, Agent, or Firm* — Wolf, Greenfield & Sacks, P.C.

(57) ABSTRACT

A method for forming a back-side illuminated image sensor from a semiconductor substrate, including the steps of: a) thinning the substrate from its rear surface; b) depositing, on the rear surface of the thinned substrate, an amorphous silicon layer of same conductivity type as the substrate but of higher doping level; and c) annealing at a temperature enabling to recrystallized the amorphous silicon to stabilize it.

20 Claims, 2 Drawing Sheets

METHOD FOR FORMING A BACK-SIDE ILLUMINATED IMAGE SENSOR

CROSS REFERENCE TO RELATED APPLICATIONS

This application claims the priority benefit of French patent application number 11/53179, filed on Apr. 12, 2011, entitled METHOD FOR FORMING A BACK-SIDE ILLUMINATED IMAGE SENSOR, which is hereby incorporated by reference to the maximum extent allowable by law.

BACKGROUND

1. Technical Field

Embodiments relate to a method for forming a back-side illuminated image sensor. It also aims at a sensor formed according to this method.

2. Discussion of the Related Art

FIG. 1 is a cross-section view schematically and partially showing a back-side illuminated image sensor 1. To form such a sensor, it is started from a semiconductor substrate of standard thickness, for example, a few hundreds of μm, which is thinned from its rear surface to provide a substrate 3 having a thickness ranging from a few micrometers to some ten micrometers. The initial substrate may be a substrate of semiconductor-on-insulator type, a solid silicon substrate possibly coated with an epitaxial layer, or any other type of semiconductor substrate capable of being thinned from its rear surface. In the present example, substrate 3 is of type P.

Before the thinning step, insulating regions 5 forming vertical partitions are formed in the upper portion of the substrate. Regions 5 extend in the substrate, from its front surface and perpendicularly to this surface, down to an intermediary depth. In top view (not shown), regions 5 delimit a plurality of rectangular substrate portions 3a and 3b. Each portion 3a is intended to comprise at least one photodiode and may comprise charge transfer devices (not shown), corresponding to a pixel of the sensor, and each portion 3b is intended to comprise one or several control transistors (not shown). To form insulating regions 5, openings in the form of trenches are etched into the substrate down to the desired depth, and filled with an insulating material such as silicon oxide. After the etching, but before the filling, dopant elements are implanted from the internal walls of the trenches, to create, at the interface between substrate 3 and insulator 5, a thin layer 7 of same conductivity type as the substrate but of higher doping level. Layer 7 especially enables to limit so-called dark currents. Such parasitic currents are due to the spontaneous random generation of electron-hole pairs at the level of certain defects of the crystal structure of the substrate. They are capable of appearing and of being collected by photodiodes even in the absence of any illumination of the sensor. Such currents disturb the sensor operation. In particular, at the interface between substrate 3 and insulator 5, crystal defects created on opening of the trenches are capable of generating dark currents.

The provision of layer 7 enables to both strongly decrease the electron generation rate close to the interface, and increase the probability, when an electron is generated close to the interface, for the latter to be recombined with a hole and thus not to be collected by a photodiode.

After the forming of insulating regions 5, photodiodes and charge transfer devices (not shown) are formed in the upper portion of substrate portions 3a, and control transistors (not shown) are formed inside and on top of substrate portions 3b. The control transistors of a substrate portion 3b may be shared between several neighboring photodiodes, for example between four photodiodes associated with four neighboring substrate portions 3a.

The front surface of substrate 3 is then coated with a stack 9 of insulating and conductive layers in which the various sensor interconnections are formed. In particular, each substrate portion 3a or 3b is topped with a biasing contacting area 11 formed in stack 9. Each area 11 contacts a P-type region 13 of higher doping level than the substrate, formed in the upper portion of the corresponding substrate portion 3a or 3b. The interconnection tracks and vias, other than those forming areas 11, have not been shown in FIG. 1.

After the forming of stack 9, a holding handle (not shown) is bonded to the upper surface of the sensor, and the substrate is thinned from its rear surface to reach insulating regions 5. As an example, the thickness of substrate 3 remaining after the thinning ranges from 1 to 10 μm. Substrate portions 3a, 3b are then totally insulated from one another by insulating regions 5. In operation, the biasing of substrate portions 3a and 3b to a common reference voltage will be provided via contacting areas 11.

After the thinning, a step of implantation of dopant elements from the rear surface of substrate 3 is provided, to form a layer 15 of same conductivity type as the substrate but of greater doping level. Layer 15 extends from the thinned surface (rear surface) of the semiconductor substrate, across a thickness ranging from 50 to 200 nm. It has the function of limiting dark currents due to the inevitable presence of crystal defects at the level of the rear surface of substrate portions 3a and 3b. Layer 15 is discontinuous, and stops at the level of insulating regions 5.

After the forming of layer 15, a laser surface anneal of the rear surface of the substrate is provided to stabilize this surface. A thin insulating layer 17, for example, a silicon oxide layer with a thickness of a few nanometers, is then formed on the rear surface of substrate 3. Layer 17 is itself coated with an antireflection layer 19, for example formed of a stack of several transparent dielectric layers of different indexes. Antireflection layer 19 is topped with juxtaposed color filtering elements, altogether forming a layer 21. In the shown example, a first substrate portion 3a containing a first photodiode is topped with a green filtering element (G) and a second substrate portion 3a containing a second photodiode is topped with a blue filtering element (B). Microlenses 23 are formed on top of filtering layer 21, in front of substrate portions 3a.

A first disadvantage of this type of sensor is the need to provide an implantation of dopant elements from the rear surface of the substrate after the thinning step, to form layer 15. At this stage of the manufacturing, the front surface of the sensor is already coated with a stack of insulating and metallic layers. There thus is a risk of contamination of the implantation equipment by the interconnection metals arranged on the front surface (for example, copper). In practice, this forces to use implantation equipment specifically dedicated to the forming of layer 15, separate from the equipment already provided to perform implantations from the front surface of the substrate.

Another disadvantage of this type of sensor is that the thickness of layer 15 is relatively large and poorly controlled. This adversely affects the sensor sensitivity, especially for wavelengths for which the photons are absorbed by very small silicon thicknesses (blue or ultraviolet). If layer 15 is too thick, photons may be absorbed in this layer. Now, this layer is precisely provided to limit the generation of electrons (to decrease dark currents). This results in a decrease in the sensor sensitivity for such wavelengths.

Another disadvantage of such a sensor is the significant surface area taken up by biasing contacting areas 11 and by the corresponding silicon regions 13. Such areas are necessary to provide, in operation, the biasing of substrate portions 3a and 3b to a common reference voltage, but their presence increases the total silicon surface area necessary to form the sensor. Further, the provision of areas 11 and of regions 13 in substrate portions 3a containing photodiodes tends to increase dark currents in the sensor.

SUMMARY

Thus, an embodiment aims at providing a method for forming a back-side illuminated image sensor which at least partly overcomes some of the disadvantages of usual solutions.

An embodiment aims at providing such a method enabling to do away with a step of implantation of dopant elements from the rear surface of the substrate.

Another embodiment aims at providing a back-side illuminated image sensor, which at least partly overcomes some of the disadvantages of usual sensors.

An embodiment aims at providing such a sensor having a decreased number of substrate biasing contacting areas with respect to usual sensors.

An embodiment aims at providing such a sensor having a better sensitivity than usual sensors, especially for wavelengths with a small penetration into silicon.

Thus, an embodiment provides a method for forming a back-side illuminated image sensor from a semiconductor substrate, this method comprising the steps of: a) thinning the substrate from its rear surface; b) depositing, on the rear surface of the thinned substrate, an amorphous silicon layer of same conductivity type as the substrate but of higher doping level; and c) annealing at a temperature enabling to recrystallize the amorphous silicon to stabilize it.

According to an embodiment, at step c), the anneal is performed at a temperature ranging between 350° C. and 450° C.

According to an embodiment, before step a), insulating regions orthogonal to the front surface of the substrate are formed from the front surface, delimiting first substrate portions intended to comprise at least photodiodes, and second substrate portions intended to comprise control transistors, and during step a), the substrate is thinned to reach the insulating regions.

According to an embodiment, the forming of the insulating regions comprises the steps of: opening trenches in the substrate; implanting dopant elements in the substrate from the internal walls of the trenches; and filling the trenches with an insulating material.

According to an embodiment, the forming of the insulating regions comprises the steps of: opening trenches in the substrate; implanting dopant elements in the substrate from the internal walls of the trenches; coating the internal walls of the trenches with an insulating material; and filling the trenches with polysilicon.

According to an embodiment, the method further comprises, after step c), a step of laser surface re-melting of the rear surface of the sensor.

Another embodiment provides a back-side illuminated image sensor formed from a semiconductor substrate, wherein a layer of same conductivity type as the substrate but of higher doping level extends from the rear surface of the substrate, across a small thickness and over the entire rear surface of the sensor.

According to an embodiment, the above-mentioned thickness ranges between 10 and 100 nm.

According to an embodiment, insulating regions extend perpendicularly from the front surface of the substrate to the layer of small thickness, delimiting first substrate portions, each containing at least one photodiode, and second substrate portions, each containing one or several control transistors.

According to an embodiment, second portions are in contact, by their front surfaces, with metallizations intended to provide both the biasing of these portions and that of the neighboring first portions.

According to an embodiment, neighboring substrate portions are separated by partitions, each comprising two parallel insulating regions bordering a polysilicon area and the polysilicon areas are in contact, by their rear surfaces, with the layer of small thickness, and by their front surfaces, with metallizations intended to provide the substrate biasing.

The foregoing and other objects, features, and advantages will be discussed in detail in the following non-limiting description of specific embodiments in connection with the accompanying drawings.

DETAILED DESCRIPTION

Figure 1:
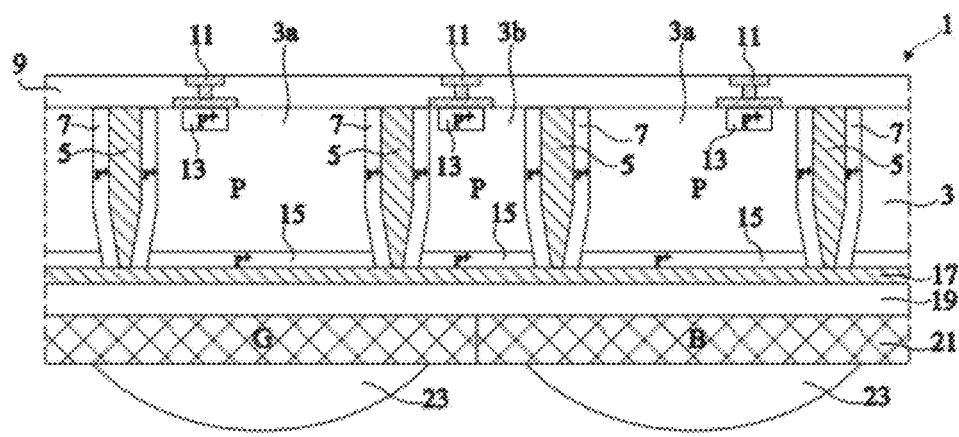
FIG. 1, previously described, is a cross-section view schematically and partially showing a back-side illuminated image sensor.

For clarity, the same elements have been designated with the same reference numerals in the different drawings and, further, as usual in the representation of integrated circuits, the various drawings are not to scale.

FIGS. 2A to 2D are partial simplified cross-section views illustrating steps of an embodiment of a method for forming a back-side illuminated image sensor 31.

Figure 2A:
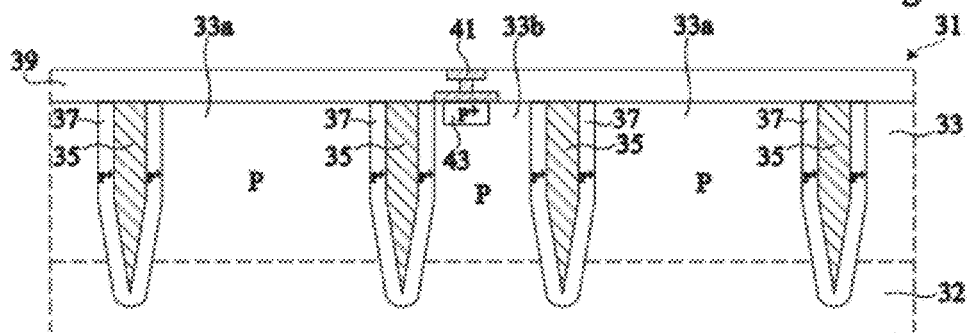
FIGS. 2A to 2D are partial simplified cross-section views illustrating steps of an embodiment of a method for forming a back-side illuminated image sensor.

FIG. 2A illustrates the forming of various sensor components on the front surface side of a semiconductor substrate. "Semiconductor substrate" designates any type of substrate adapted to the forming of a back-side illuminated image sensor. In the present example, it is a solid silicon support 32 coated with a lightly-doped P-type epitaxial layer 33. Support 32 may have a thickness of a few hundreds of µm, for example, ranging between 500 and 800 µm, and epitaxial layer 33 may have a thickness of a few µm, for example, ranging between 1 and 10 µm. After a subsequent thinning step, only epitaxial layer 33 or a portion of this layer will remain. This layer 33 thus forms the actual sensor substrate.

Before the thinning step, insulating regions 35, forming vertical partitions, are formed in the upper portion of the substrate. Regions 35 extend from the front surface of the substrate and perpendicularly to this surface, down to an intermediary depth, for example, of a few micrometers. It should be noted that "perpendicularly" here means substantially perpendicularly, for example, forming an angle ranging between 70 and 120 degrees with the front surface. Actually, in this example, regions 35 have a pointed tapered shape. In the shown example, regions 35 thoroughly cross epitaxial layer 33 and slightly extend into support 32. In top view (not shown), regions 35 delimit a plurality of substrate portions 33a and 33b, for example, rectangular. Each portion 33a is intended to comprise at least one photodiode and may comprise charge transfer devices (not shown), corresponding to a pixel of the sensor, and each portion 33b is intended to comprise one or several control transistors (not shown).

To form regions 35, trenches are opened in the substrate at the desired depth, for example, by local etching, and filled with an insulating material such as silicon oxide. After the opening of the trenches but before their filling, an implantation of dopant elements may be performed from the internal trench walls, to create a thin layer 37 of same conductivity type as the substrate but of greater doping level at the interface between insulating material 35 and substrate 33. Layer 37 especially enables limiting dark currents that are generated at this interface.

After the forming of insulating regions 35, photodiodes and charge transfer devices (not shown) are formed in substrate portions 33a, and control transistors (not shown) are formed inside and on top of substrate portions 33b.

The front surface of substrate 33 is then coated with a stack 39 of insulating and conductive layers where the various sensor interconnections are formed. In particular, in the shown example, each substrate portion 33b has an associated biasing contacting area 41 formed in stack 39. Area 41 contacts a P-type region 43 of higher doping level than the substrate, formed at the surface of substrate portion 33b. The interconnection tracks and vias, other than those forming areas 41, have not been shown in FIGS. 2A to 2D.

Figure 2B:
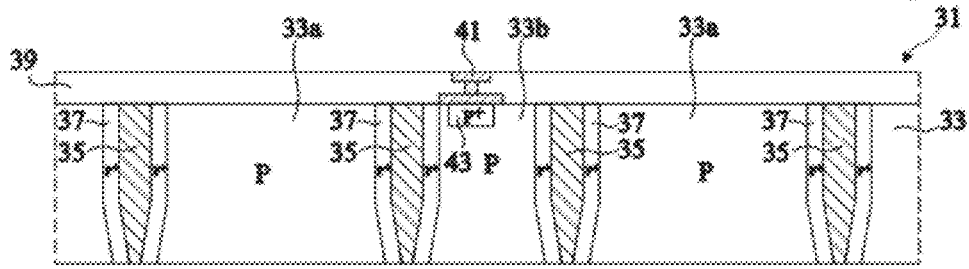

FIG. 2B illustrates the actual thinning step. After the forming of stack 39, a holding handle (not shown) is bonded to the front surface of the sensor, and the substrate is thinned from its rear surface to reach insulating regions 35. In this example, during the thinning, silicon support 32 is fully removed and only epitaxial layer 33 is maintained. Substrate portions 33a, 33b are then totally insulated from one another by insulating regions 35 which are exposed on the rear surface side of the thinned substrate.

Figure 2C:
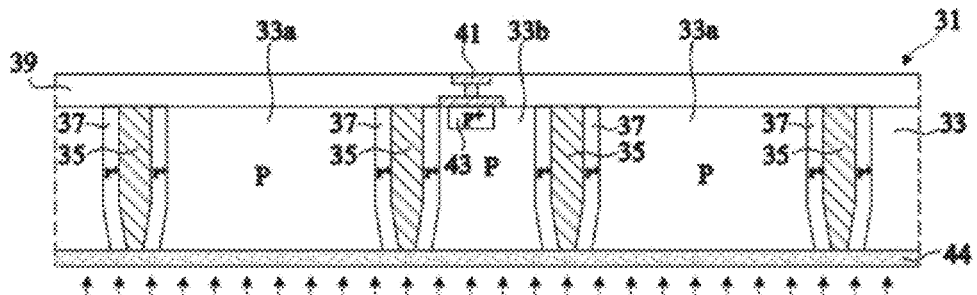

FIG. 2C illustrates a step subsequent to the thinning, comprising the forming of an amorphous silicon layer 44 of same conductivity type as substrate 33 but of higher doping level, extending across the entire rear surface of the thinned substrate. Amorphous silicon has the advantage of being able to be deposited at low temperature, for example, at a temperature lower than 400° C., very heavily doped, and in a very thin layer. The thickness of layer 44 for example ranges between 10 and 100 nm.

After the deposition of amorphous silicon layer 44, an in situ anneal step (that is, in the same equipment as that used to deposit layer 44), at a temperature slightly greater than the deposition temperature, enables the recrystallization of the amorphous silicon. The anneal temperature is selected to be sufficiently low to avoid damaging the components already formed, for example, approximately ranging between 350 and 450° C.

After the forming of layer 44, an additional laser surface anneal of the rear surface may optionally be provided to improve the crystal quality of layer 44. The laser anneal enables to significantly raise the rear surface temperature, across a small thickness, while maintaining a low temperature in the upper portion of the substrate to avoid damaging the components already formed on the front surface side. As an example, during the optional laser anneal, the rear surface temperature may be raised up to more than 1,000° C. across a thickness ranging from 50 to 200 nm, while the temperature in the upper portion of the substrate remains much lower than the interconnection metallization deposition temperature. During the laser anneal, layer 44, and possibly a small thickness of substrate 33, may melt, whereby, on the one hand, the doping level is homogenized in the molten thickness and, on the other hand, a crystallization resulting in the forming of a single-crystal silicon layer of same conductivity type as the substrate but of greater doping level, extending over the entire rear surface of the substrate, is achieved.

In all cases, after the in situ anneal of amorphous silicon 44, possible followed by a surface laser anneal, a crystallized silicon layer, of same conductivity type as the substrate but of greater doping level, extends over the entire rear surface of the substrate. This layer, bearing reference numeral 45 in FIG. 2D, especially enables limiting dark currents due to the inevitable presence of crystal defects at the level of the rear surface of substrate portions 33a and 33b.

In the absence of laser anneal, the thickness of layer 45 is substantially equal to the thickness of amorphous silicon 44 deposited at the step illustrated in FIG. 2C, for example, approximately ranging between 10 and 100 nm. If a laser anneal is provided, causing a partial re-melting of the rear surface, the thickness of layer 45 especially depends on the setting of the laser equipment and on the anneal duration. As an example, it may range from 50 to 200 nm.

Figure 2D:
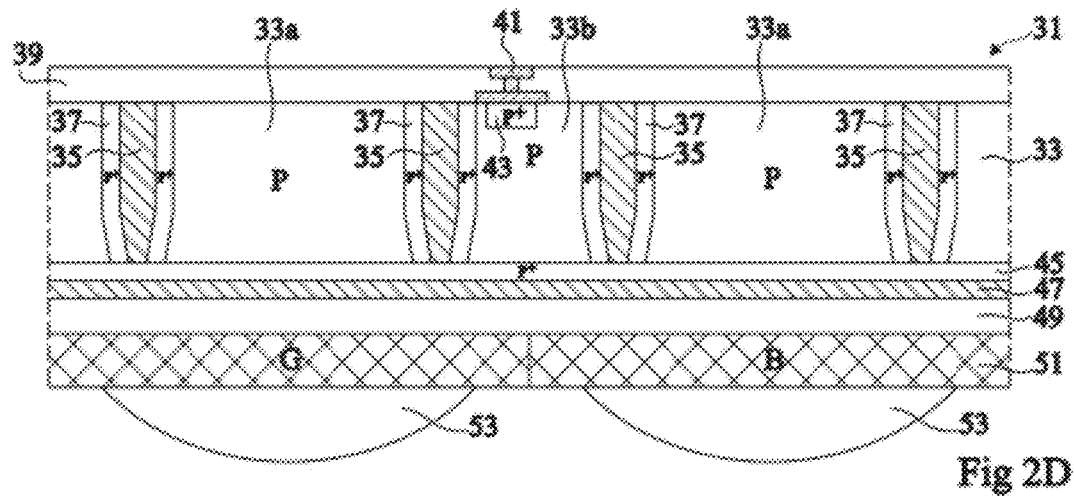

FIG. 2D illustrates final steps of the forming of sensor 31, corresponding to conventional steps of the forming of a backside illuminated image sensor. A thin insulating protection layer 47 is formed on the rear surface of layer 45 after the laser anneal step. Layer 47 is itself coated with an antireflection layer 49. Antireflection layer 49 is coated with juxtaposed color filtering elements G, B altogether forming a filtering layer 51. Microlenses 53 are formed above filtering layer 51, in front of substrate portions 33a.

An advantage of the method described in relation with FIGS. 2A to 2D is that it enables to form, on the rear surface side of substrate 33, a layer 45 of the same conductivity type as the substrate but of greater doping level, without for all this to provide a step of implantation of dopant elements from the rear surface of the sensor.

Another advantage of this method is that layer 45 thus formed may be much thinner (especially in the absence of the laser anneal) than layers usually formed by implantation, such as layer 15 of the sensor described in relation with FIG. 1. This enables to increase the sensor sensitivity, especially for wavelengths with a small penetration into silicon.

Another advantage of sensors formed according to the provided method is that layer 45 is continuous, and in particular is not interrupted at the level of insulating regions 35. Layer 45 thus enables to provide a uniform biasing of all substrate portions 33a and 33b of the sensor, via the sole contacting areas 41 connected to substrate portions 33b. The absence of contacting areas at the level of substrate portions 33a enables to both decrease the bulk and decrease leakage currents.

Figure 3:
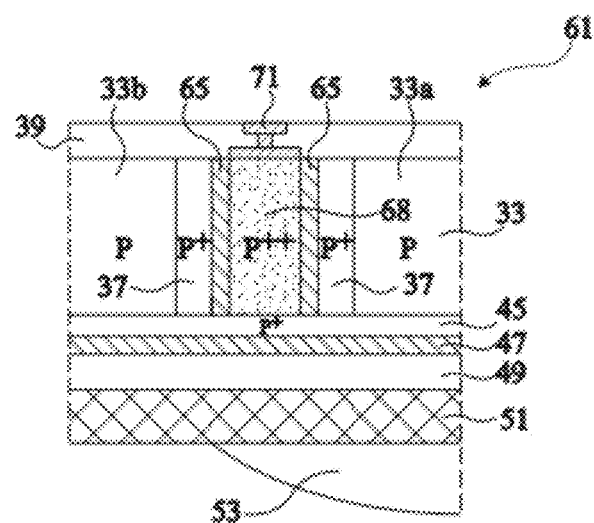
FIG. 3 is a partial simplified cross-section view illustrating an alternative embodiment of the method described in relation with FIGS. 2A to 2D.

FIG. 3 is a partial simplified cross-section view illustrating another embodiment of method for manufacturing a backside illuminated image sensor 61. This embodiment differs from the method of FIGS. 2A to 2D essentially by the nature of the insulating regions delimiting substrate portions 33a and 33b containing the photodiodes and the control transistors of the sensor.

Instead of regions 35 of FIGS. 2A to 2D, insulating regions 65, orthogonal to the front surface, are provided in the upper portion of the substrate. Regions 65 are not, like regions 35, totally filled with an insulating material, but are formed by the insulating coating of partitions having a doped polysilicon core 68, for example of same conductivity type as the substrate but of higher doping level.

To form regions 65 and areas 68, trenches are opened in the substrate at the desired depth. The lateral walls and the bottom of these trenches are coated with an insulating material such as silicon oxide, after which the trenches are filled with doped polysilicon. After the opening, but before the deposition of coating 65, dopant elements are implanted from the internal walls of the trenches, to create, at the interface between the insulating material and the substrate, a thin layer 37 of same conductivity type as the substrate but of higher doping level.

The front surface of substrate 33 is covered with a stack 39 of insulating and conductive layers where the various sensor interconnections are formed. In particular, in the shown example, the front surface of each polysilicon areas 68 is contacted by an area 71 formed in stack 39.

The substrate is then thinned to reach polysilicon areas 68, so that these areas are exposed on the thinned surface side. At this stage, substrate portions 33a and 33b are totally insulated from one another by insulating regions 65 which are exposed on the rear surface side. In particular, neighboring substrate portions 33a and/or 33b are separated by a partition comprising two parallel insulating regions 65 bordering a polysilicon area 68.

The rest of the process corresponds to the steps described in relation with FIGS. 2A to 2D, and especially comprises the forming of a layer 45, of same conductivity type as the substrate but of higher doping level, extending over the entire rear surface of the thinned substrate. Layer 45 is in direct contact with the rear surface of polysilicon areas 68.

This embodiment has the same advantages as the embodiment described in relation with FIGS. 2A to 2D, and further has the advantage that it is no longer necessary to provide biasing contacting areas in substrate portions 33b comprising control transistors. Indeed, areas 71 enable to directly provide the biasing of layer 45, and thus of substrate portions 33a and 33b, via polysilicon areas 68.

Specific embodiments have been described. Various alterations, modifications, and improvements will occur to those skilled in the art. In particular, those skilled in the art may provide other biasing contacting areas than those provided in the examples described in relation with FIGS. 2A to 2D, and 3.

Further, embodiments are limited neither to the thicknesses of the different layers, nor to the anneal temperatures mentioned as an example hereabove. Embodiments are not limited either to the conductivity types mentioned as an example in the present description.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a back-side illuminated image sensor from a semiconductor substrate, this method comprising:
   a) thinning the substrate from its rear surface;
   b) depositing, on the rear surface of the thinned substrate, an amorphous silicon layer of same conductivity type as the substrate but of higher doping level; and
   c) annealing at a temperature enabling to recrystallize the amorphous silicon to stabilize it,
   wherein the amorphous silicon layer of same conductivity type but of higher doping level is thinner than the thinned substrate.

2. The method of claim 1, wherein at step c), the anneal is performed at a temperature ranging between 350° C. and 450° C.

3. The method of claim 1, wherein:
   before step a), insulating regions orthogonal to the front surface of the substrate are formed from said front surface, delimiting first substrate portions intended to comprise at least photodiodes, and second substrate portions intended to comprise control transistors; and
   at step a), the substrate is thinned to reach said insulating regions.

4. The method of claim 3, wherein the forming of said insulating regions comprises the steps of:
   opening trenches in the substrate;
   implanting dopant elements in the substrate from the internal walls of the trenches; and
   filling the trenches with an insulating material.

5. The method of claim 3, wherein the forming of said insulating regions comprises the steps of:
   opening trenches in the substrate;
   implanting dopant elements in the substrate from the internal walls of the trenches;
   coating the internal walls of the trenches with an insulating material; and
   filling the trenches with polysilicon.

6. The method of claim 1, further comprising, after step c), a step of laser surface re-melting of the rear surface of the sensor.

7. The method of claim 6, wherein the step of laser surface re-melting is performed on a portion of the amorphous silicon layer.

8. The method of claim 1, further comprising, after step c), homogenizing a doping level of at least a portion of the amorphous silicon layer via laser surface re-melting.

9. A back-side illuminated image sensor formed from a semiconductor substrate, wherein a layer of same conductivity type as the substrate but of higher doping level extends from the rear surface of the substrate, across a small thickness and over the entire rear surface of the sensor, and wherein the layer of same conductivity type but of higher doping level is thinner than the substrate.

10. The sensor of claim 9, wherein said small thickness ranges between 10 and 100 nm.

11. The sensor of claim 9, wherein insulating regions extend perpendicularly from the front surface of the substrate to said layer, delimiting first substrate portions, each containing at least one photodiode, and second substrate portions, each containing one or several control transistors.

12. The sensor of claim 11, wherein first portions are in contact, by their front surfaces, with metallizations intended to provide both the biasing of said portions and that of the neighboring second portions.

13. The sensor of claim 11, wherein:
   neighboring substrate portions are separated by partitions, each comprising two parallel insulating regions bordering a polysilicon area; and
   said areas are in contact, by their rear surfaces, with said layer, and by their front surfaces, with metallizations intended to provide the substrate biasing.

14. The sensor of claim 9, wherein the layer of same conductivity type as the substrate but of higher doping level is configured to enable biasing of a portion of the substrate.

15. The sensor of claim 14, wherein the layer of same conductivity type as the substrate but of higher doping level is configured to enable biasing a portion of the substrate by biasing an amorphous silicon core of a region oriented orthogonally to the front surface of the substrate.

16. The sensor of claim 9, further comprising a single-crystal layer, layered adjacent to the layer of same conductivity type but of higher doping level.

17. The sensor of claim 16, wherein the layer of same conductivity type as the substrate but of higher doping level is thicker than the single-crystal layer.

18. The sensor of claim 16, wherein the single-crystal layer enables greater sensor sensitivity for blue and ultraviolet wavelengths of light.

19. The sensor of claim 16, wherein the single-crystal layer has a thickness that ranges between 10 and 100 nm.

20. The sensor of claim 9, wherein said small thickness ranges between 50 and 200 nm.

* * * * *